United States Patent [19]

Adam

[11] Patent Number: 5,023,573

[45] Date of Patent: Jun. 11, 1991

[54] COMPACT FREQUENCY SELECTIVE LIMITER CONFIGURATION

[75] Inventor: John D. Adam, Murrysville, Pa.

[73] Assignee: Westinghouse Electric Corp., Pittsburgh, Pa.

[21] Appl. No.: 410,575

[22] Filed: Sep. 21, 1989

[51] Int. Cl.$^5$ ............................................. H01P 1/218
[52] U.S. Cl. ................................... 333/17.2; 333/24.2
[58] Field of Search ................... 333/24.1, 24.2, 24.3, 333/17.2, 158, 81 A, 1

[56] References Cited

U.S. PATENT DOCUMENTS

| | | | |
|---|---|---|---|
| 2,721,312 | 10/1955 | Grieg et al. | 333/238 |
| 3,588,759 | 6/1971 | Buck et al. | 333/24.1 X |
| 4,005,375 | 1/1976 | Pringle et al. | 333/17.2 X |
| 4,044,357 | 8/1977 | Goldie . | |
| 4,152,676 | 5/1979 | Morgenthaler et al. | 333/24.1 |
| 4,155,053 | 5/1979 | Stitzer et al. . | |
| 4,243,697 | 1/1981 | Glass et al. . | |
| 4,251,786 | 2/1981 | Goldie et al. . | |
| 4,283,692 | 8/1981 | Adam . | |
| 4,325,140 | 4/1982 | Stitzer . | |
| 4,488,122 | 12/1984 | Wolkstein . | |
| 4,595,889 | 6/1986 | Stitzer et al. | 333/17.2 |
| 4,642,584 | 2/1987 | Funck et al. . | |
| 4,675,682 | 6/1987 | Adam et al. . | |
| 4,690,726 | 9/1987 | Luther et al. . | |
| 4,754,243 | 6/1988 | Armstrong et al. . | |
| 4,845,439 | 7/1989 | Stitzer et al. | 333/17.2 |

Primary Examiner—Paul Gensler
Attorney, Agent, or Firm—W. G. Sutcliff

[57] ABSTRACT

A frequency selective limiting device is described incorporating a pair of generally planar ferrite members and a plurality of signal-carrying conductors positioned between the ferrite members. The plurality of signal-carrying conductors are located on a single YIG substrate. A D.C. bias field may be generated by a common magnetic source positioned on the surface of the substrate opposite the plurality of signal-carrying conductors.

15 Claims, 5 Drawing Sheets

COMPACT FREQUENCY SELECTIVE LIMITER CONFIGURATION

BACKGROUND OF THE INVENTION

1. Field of the Invention:

This invention relates to attenuating devices, and more particularly, to devices which utilize a YIG material to provide frequency selective attenuation of microwave signals above a preselected threshold power level.

2. Description of Related Art:

Frequency selective limiting (FSL) or attenuating devices which utilize a yttrium-iron-garnet (YIG) material have the property of being able to attenuate higher power level signals while simultaneously allowing lower power level signals, separated by only a small frequency offset from the higher level signals, to pass with relatively low loss. YIG-based FSLs are capable of limiting or attenuating across more than an octave bandwidth in the 2-8 GHz range. Higher power level (above-threshold) signals within a selectivity bandwidth will be attenuated without requiring tuning of the FSL. Lower power level (below-threshold) signals, separated from the higher power level signals by more than a few spinwave linewidths, will pass through the FSL without experiencing any greater loss than if the higher power level signals were not present. For an attenuating device based on YIG, this selectivity bandwidth is on the order of between 20-50 MHz.

YIG-based FSLs have many applications in microwave signal systems. One such application is illustrated in FIG. 1. The microwave signal system 10 includes an antenna 12 for collecting and passing microwave RF signals, a YIG-based FSL device 16 and a broadband receiver 14 (hereafter sometimes referred to as receiver 14). Microwave signal processing equipment 18 is responsive to the output of the receiver 14. The microwave signal processing equipment 18 is of a type presently known in the art and will not be further described.

FSL 16 is utilized to increase the dynamic range over which microwave signals collected by the antenna 12 can be accepted by the receiver 14. Because known receivers such as broadband receiver 14 generally have a dynamic range of approximately 35 dB, and signals of interest arriving at antenna 12 may have a dynamic range of, for example, 85 dB, it can be readily appreciated that a power mismatch is created within system 10. The mismatch is corrected by utilizing the FSL device 16 which may be designed to provide a dynamic range of about 50 dB, approximately mid-point between the signal level at the antenna 12 and the dynamic range of the receiver 14.

FSL 16 is designed to provide that the ratio of power out to power in ($P_{out}/P_{in}$), below a predetermined threshold value of $TP_{in}$, is substantially linear. As the value of input power $P_{in}$ seen by FSL 16 increases above the predetermined threshold value of $TP_{in}$, the ratio of $P_{out}/P_{in}$ becomes smaller. Stated in another manner, FSL device 16 operates to attenuate an above threshold, high power input microwave signal having a large dynamic range to provide an output signal having a smaller dynamic range.

A YIG-based frequency selective limiting (FSL) device 20 discussed in U.S. Pat. No. 4,845,439; entitled "Frequency Selective Limiting Device," in the name of Steven N. Stitzer et al. and assigned to Westinghouse Electric Company the assignee of the present invention is illustrated in FIGS. 2A and 2B. Attenuation in the FSL 20 is proportional to the volume of YIG material in layers 22 and 24 which is coupled to the RF magnetic-field 26 generated by the signal-carrying conductor 28. While the configuration and positioning of the YIG layers 22 and 24 relative to the signal-carrying conductor 28 results in satisfactory coupling of the RF magnetic field 26 with YIG material in layers 22 and 24, the configuration of the FSL 20 is difficult and expensive to fabricate.

According to current manufacturing procedures a narrow signal-carrying conductor 28 is sandwiched between two thin layers 22 and 24 of single crystal yttrium-iron-garnet (YIG). The YIG layers are typically about 0.002 to 0.005 inch thick. Effective limiting requires a strong coupling of RF magnetic-field 26 with the YIG for a given RF power level. Accordingly, in order to confine the magnetic-field 26 within the YIG layers 22 and 24, the sandwich is surrounded by a ground plane 29. The arrangement of FIGS. 2A and 2B ensures that substantially all the RF field lines 26 pass through the YIG layers 22 and 24.

The device 20 is currently made by epitaxially forming separately, each YIG layer as a thin layer of single crystal YIG on a gadolinium-gallium-garnet (GGG) substrate (not shown). Each layer of GGG is then removed by a grinding step. It is also necessary to use a separate metalized GGG substrate 30 as a device support. The metalized surface 32 separates the GGG substrate 30 from the YIG material of layer 24 and completing the group plan. The current process is expensive and time consuming.

In order to achieve a greater level of attenuation, a plurality of individually formed separate devices 20 may be connected in series as shown in FIG. 3. The FSL devices 20 are positioned in parallel with a plurality of D.C. biasing magnets 34 located therebetween which provide a transverse biasing field 36. Each FSL 20 is separately manufactured.

SUMMARY OF THE INVENTION

The present invention simplifies the configuration and fabrication process of FSL devices for attenuating microwave signals. According to the present invention, a plurality of FSLs are formed on a common substrate with a common biasing magnet. According to one embodiment of the present invention, a plurality of signal-carrying conductors for carrying microwave signals are positioned on a planar ferrite member.

In another embodiment of the invention a second generally planar ferrite member is positioned on the plurality of signal-carrying conductors in confronting relationship with the first ferrite member to further enhance the attenuation of the microwave signals. First and second ferrite members are posted between a pair of planar magnets. In a preferred embodiment, the signal-carrying conductors are separated from each other by a distance sufficient to ensure negligible magnetic field coupling between adjacent conductors.

3

Figure 1:
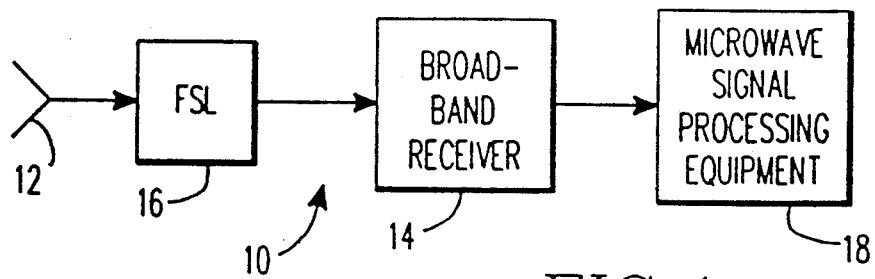
FIG. 1 is a schematic block diagram of a microwave circuit in which the frequency selective limiting device of the present invention may be utilized.
Figure 2A:
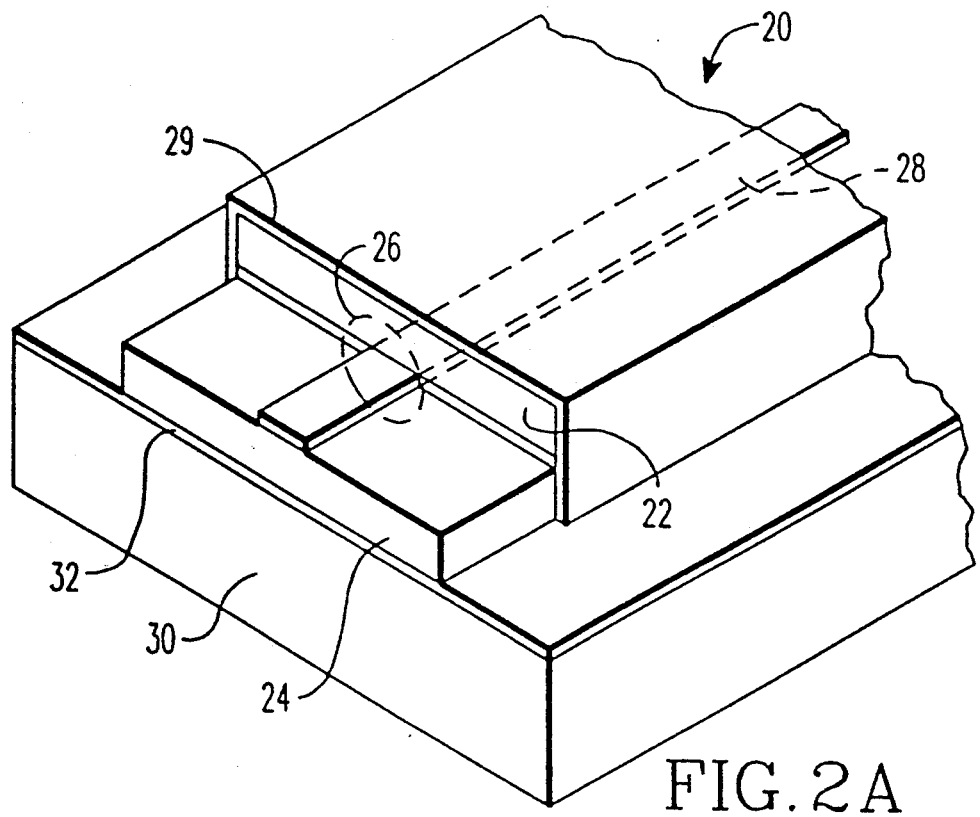
FIG. 2A is a fragmentary prespective view of a frequency selective limiting device disclosed in the above-identified copending U.S. Pat. application assigned to the assignee of the present application.
Figure 2B:
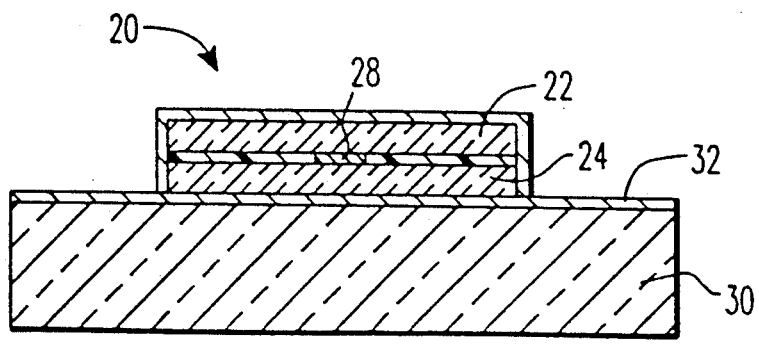
Figure 3:
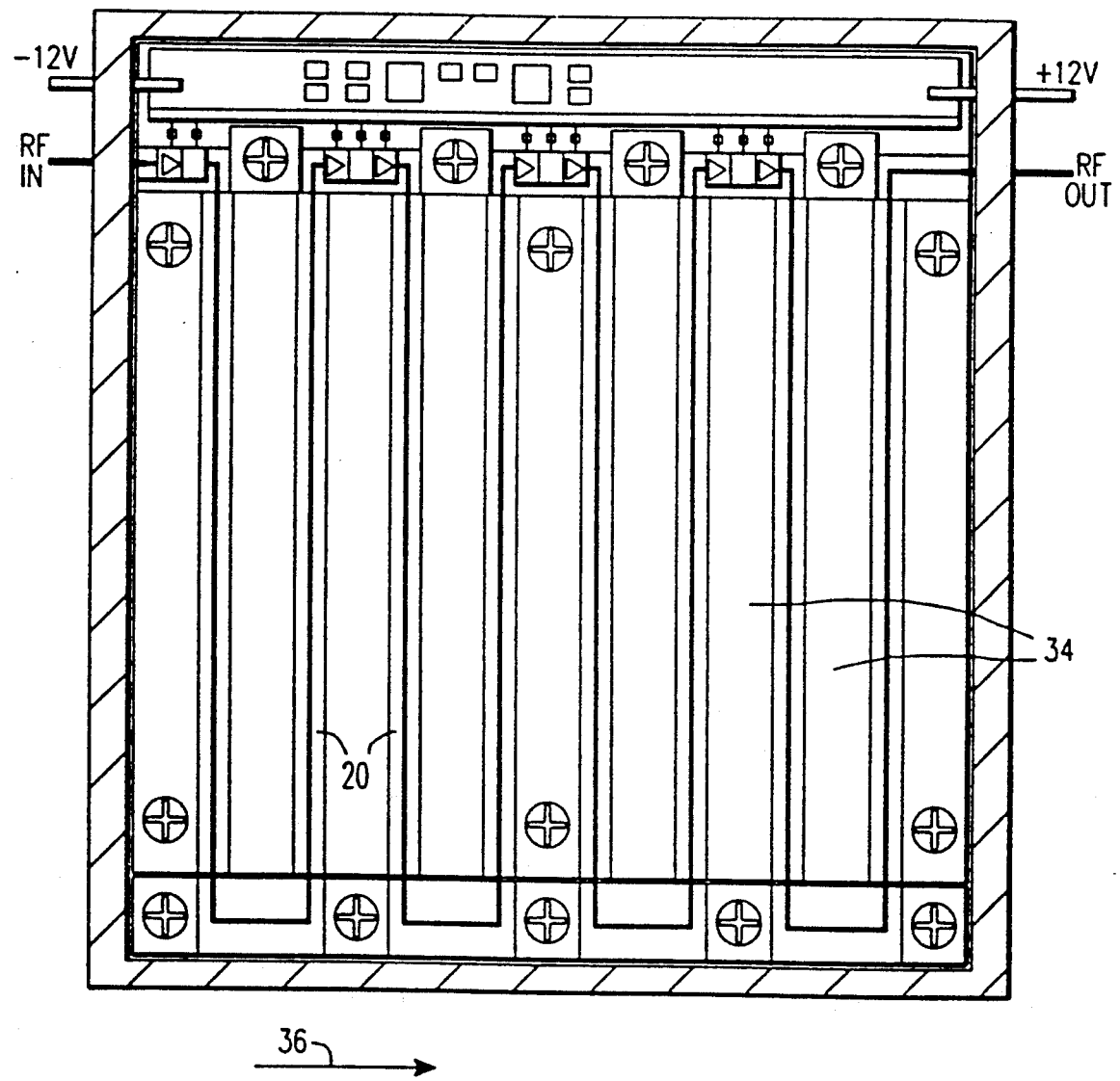
Figure 4:
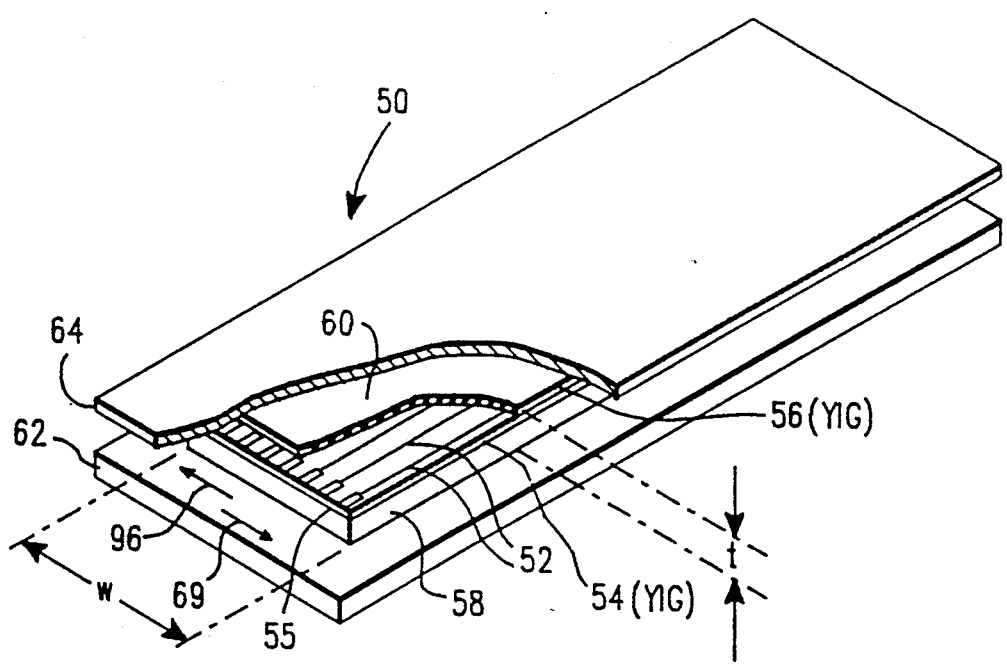
Figure 5:
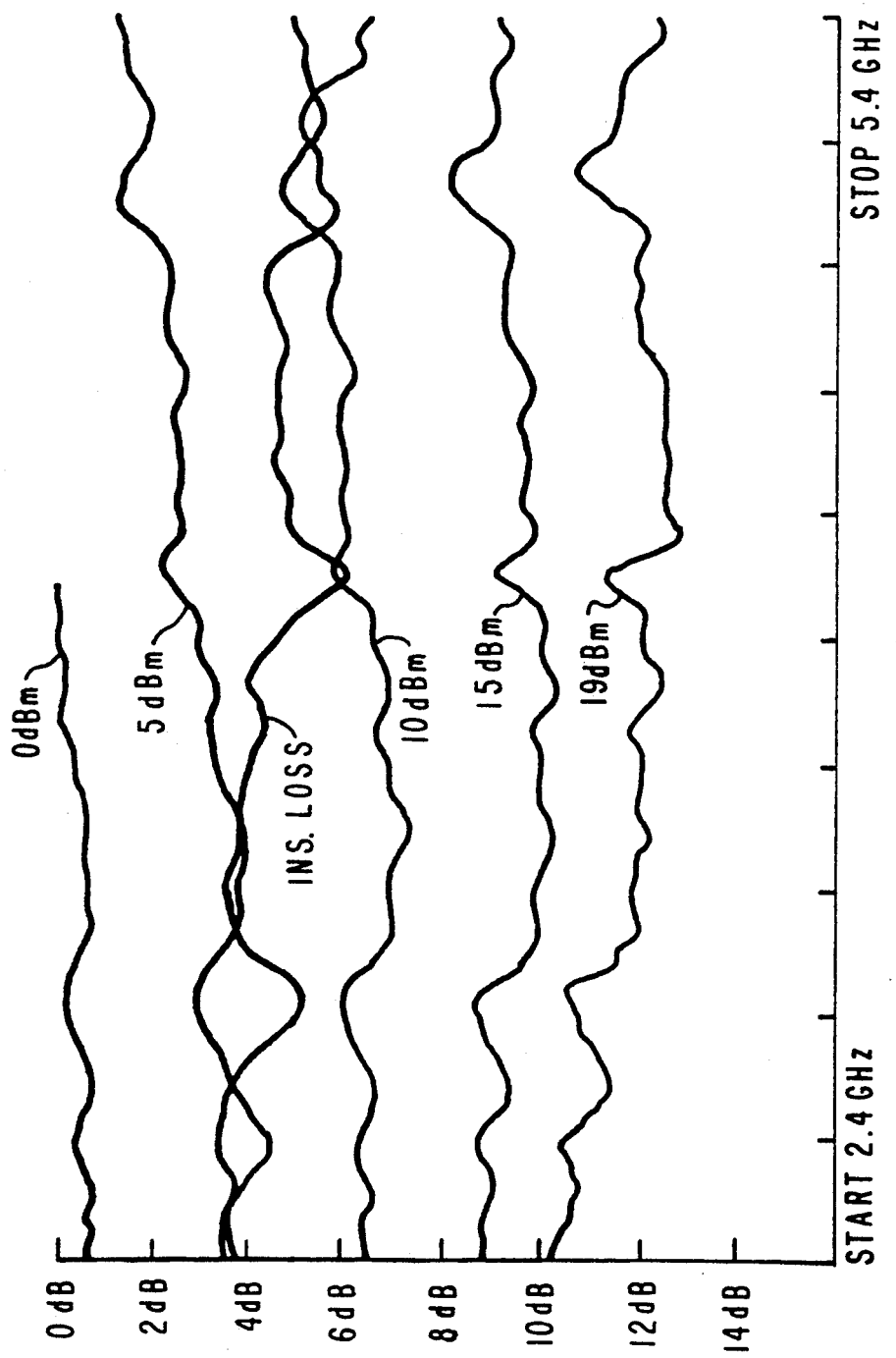

FIG. 2B is a side sectional view of the FSL device of FIG. 2A;

FIG. 3 is a top view of eight frequency selective limiting devices, as shown in FIG. 2A and 2B, connected in series;

FIG. 4 is a fragmentary perspective view of a frequency selective limiting device according to the present invention;

FIG. 5 illustrates graphically the measured limiting of one of the strips in an FSL device according to the embodiment shown in FIG. 4; and FIGS. 6A through 6E illustrate in a series of side sectional views the sequence of steps for assembling the FSL device of FIG. 4.

DESCRIPTION OF THE PREFERRED EMBODIMENTS

The theory of operation and the construction of frequency selective limiting (FSL) devices which utilize a yttrium-iron-garnet (YIG) material are described in the following articles, which are incorporated by reference herein: "Frequency Selective Microwave Power Limiting in Thin YIG Films," *IEEE Transactions on Magnetics,* Vol. MAG-19, No. 5, September 1983, Steven N. Stitzer; "A Multi-Octave Frequency Selective Limiter," 1983 *IEEE MTT-S Digest,* page 326, Steven N. Stitzer and Harry Goldie; "Non-Linear Microwave Signal-Processing Devices Using Thin Ferromagnetic Films," *Circuits Systems Signal Process,* Vol. 4, No. 1-2, 1985, page 227, Steven N. Stitzer and Peter R. Emtage.

FIG. 4 illustrates an FSL device 50 (hereinafter sometimes referred to generally as FSL 50) in accordance with the preferred embodiment of the present invention. The FSL 50 includes a plurality of signal-carrying conductors 52 of a predetermined length positioned between a pair of confronting ferrite members 54 and 56. The ferrite members 54 and 56 are yttrium-iron-garnet (YIG) based materials having a generally planar configuration respectively grown on nonmagnetic gadolinium-gallium-garnet (GGG) substrates 58 and 60. To enhance the operation of the device, a ground plane 55 may be positioned adjacent to YIG layer 54. A pair of planar D.C. biasing magnets 62 and 64 are positioned on the GGG substrates 58 and 60. The magnets 62 and 64 produce a D.C. biasing field and also provide RF shielding for the signal-carrying conductors 52. In the present invention, GGG substrates 58 and 60 are also utilized to provide mechanical support for the YIG ferrite members 54 and 56. The second YIG layer 56 provides additional attenuation of the microwave signals carried by the signal-carrying conductors 52, but is not essential to the operation of the FSL 50.

The present invention, as illustrated in FIG. 4, provides for the fabrication of a plurality of signal carrying conductors 52 on a single YIG substrate. This arrangement, incorporating only one YIG substrate, significantly reduces the volume occupied by the YIG layers 54 and 56 and biasing magnets 62 and 64 within the FSL device 50.

In the compact FSL configuration of the present invention when a ground plane 55 is employed, the signal-carrying conductors 52 are separated by about 10 times the distance from the ground plane 55 to the conductors 52. The distance from the ground plane 55 to the conductors 52 be the thickness of the YIG layer 54 plus the thickness of the GGG substrate 58. However, when the GGG layer 58 has been removed, the distance from the ground plane 55 to the conductors 52 is equal to the thickness of YIG layer 54. The YIG layer thickness is approximately 100 μm. The amount of separation is sufficient to ensure negligible coupling between adjacent conductors. When a plane 55 is not present, the separation between the conductors 52 must be increased to achieve negligible coupling between adjacent conductors. Any known fabrication process used to manufacture single strip YIG-based FSL devices may be used to manufacture the compact FSL configuration of the present invention.

The performance of the compact limiter (FIG. 4) of the present invention is generally comparable to that obtained from single conductor FSL devices (FIG. 3). One of the differences, however, is that the compact FSL 50 allows a lower biasing field than that required for single conductor FSL devices. For example, a low biasing field of about 35 Oe (Oersted or ampere per meter) is required for the compact FSL 50, whereas approximately 120 Oe is required in the conventional single conductor devices. The difference in the required bias field arises from the reduction in the demagnetizing field 96 inherently present within the YIG layers 54 and 56. The demagnetizing field 96 is dependent, in an inverse relationship, upon the aspect ratio (width (w)/thickness (t)) of the YIG layer 54 and 56 (see FIG. 3). In other words, a higher aspect ratio allows a lower bias field. In the single conductor configuration, as shown in FIG. 3, the aspect ratio is calculated to be about 12.5, as shown below.

YIG layer thickness = 100 μm (each)
Overall thickness = 200 μm
YIG width (single conductor configuration) = $\approx .1'' = 2540$ μm $$\text{Aspect Ratio} = \frac{\text{width}}{\text{thickness}} = \frac{2540 \ \mu m}{200 \ \mu m} = 12.7$$
(single conductor configurations)

In the compact multiple conductor configuration, as shown in FIG. 4, the aspect ratio is calculated to be about 63.5, as shown below.

YIG layer thickness = 100 μm (each)
Overall thickness = 200 μm
YIG width (compact multiple conductor configuration) = $\approx .5'' = 12,700$ μm $$\text{Aspect Ratio} = \frac{\text{width}}{\text{thickness}} = \frac{12,700 \ \mu m}{200 \ \mu m} = 63.5$$

FIG. 5 illustrates graphically the limiting characteristics of each of the strips in the FSL device 50 of FIG. 4. FIG. 5 plots the attenuation of the fourth strip of an 8 strip compact FSL 50 as a function of the frequency (2.4–5.4 GHz) versus different input power levels (0–19 dBm). The higher aspect ratio of the compact multiple conductor configuration (FIG. 4) allows for a more consistent limiting characteristic (see FIG. 5) than is provided by the single conductor configuration (FIG. 3) which has a lower aspect ratio. The compact FSL 50 provides a more consistent limiting characteristic curve over a wide range of frequencies by reducing the degree to which the level of limiting is frequency dependent. The flatter, or more uniform, limiting characteristic curve is a great advantage for the compact multiple conductor configuration since the attenuation loss at low frequencies is negligible compared to the attenuation loss at low frequencies with the conventional single conductor configuration. Therefore, the higher aspect ratio of the compact configuration allows for a more predictable level of attenuation across a range of frequencies than provided by the single conductor devices.

Although GGG substrate layers 58 and 60 are illustrated and described herein, other suitable materials may be utilized in forming the substrate layers. The material from which substrate layers 58 and 60 are formed should be selected to have a thermal expansion coefficient (TEC) which approximates that of YIG layers 54 and 56. For example, a high nickel alloy (70% Ni, 17% Mo, 7% Cr, 6% Fe), which has substantially the same TEC of YIG ($\Delta L/L - 10.4 \times 10^{-6}/°C$.) may be utilized if desired.

Figure 6A:
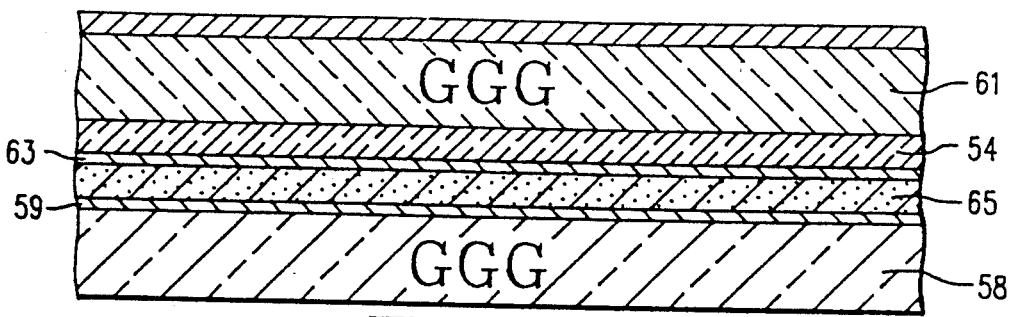

FIGS. 6A through 6E illustrate in stepwise fashion a process of forming the FSL 50 shown in FIG. 4. FIG. 6A illustrates the GGG substrate layer 58 having a metalized surface 59. GGG substrate 61 has the first YIG layer 54 epitaxially grown thereon. A metalized surface 63 is formed over YIG layer 54. The metalized surfaces 59 and 63 are bonded together in confronting relationship as shown by a conductive epoxy 65 and form part of the ground plane 55 referred to in FIG. 4.

Figure 6B:
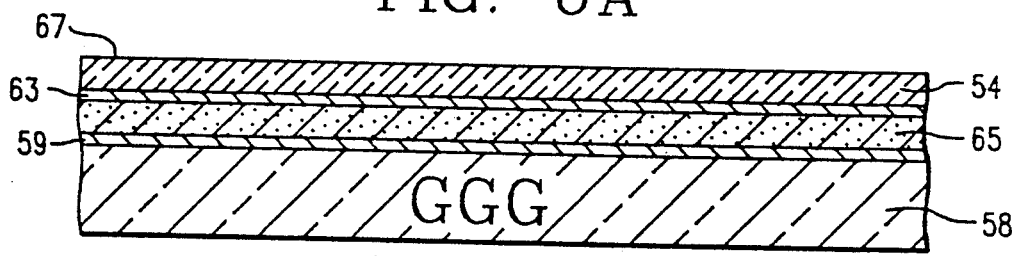
Figure 6C:
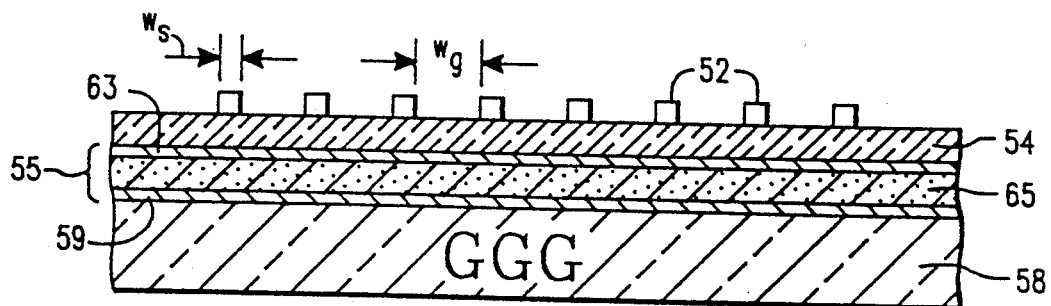

In FIG. 6B the GGG substrate 61 has been removed by grinding, leaving the upper surface 67 of the first YIG layer 54 exposed to receive a metalization layer of gold (not shown) which is thereafter etched by a photolithographic technique to form the plurality of signal carrying conductors 52 (FIG. 6C). The etching process is such that the resulting signal-carrying conductors 52 have a width $W_s$ of about 25 μm and are separated from each other by nonconductive gaps having a width $W_g$ about 1 mm. Therefore, one embodiment of the present invention, as shown in FIG. 6C, has a single ferrite layer 54 and a planar ground plane 55 formed of the metalization layers 59 and 63 and the conductive epoxy 65. Alternately the device may be formed by stretching gold wire or ribbon across the YIG layer 54 if desired.

Figure 6D:
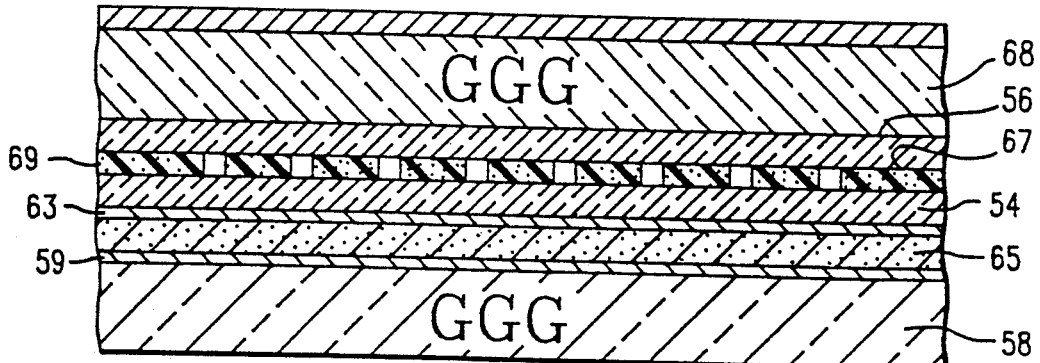
Figure 6E:
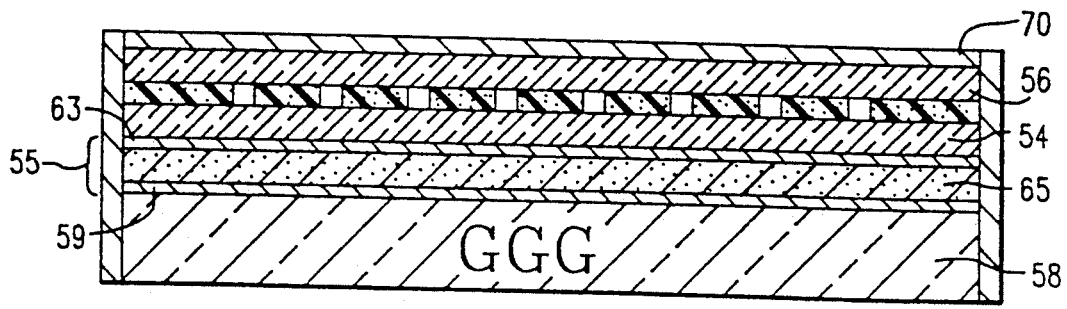

In the preferred embodiment, the second YIG layer 56 is epitaxially grown on a GGG substrate 68. Thereafter a thin layer of non-conductive epoxy paste 65, preferably of a thickness equal to the thickness of the conductors 52, is utilized to attach the second YIG layer 56 to the first YIG layer 54 in confronting relationship as shown in FIG. 6D. The GGG substrate 68 may thereafter be removed by grinding and polishing. A metalization 70 may surround the two YIG layers 54 and 56 and be in contact with the planar ground plane 55 to form a surrounding ground plane (FIG. 6E).

The principle of combining multiple FSL devices on a single YIG substrate with the magnetic bias field 69 supplied by a common magnet 62, is shown in FIG. 4. As stated earlier, the configuration of the present invention may also be applicable to different FSL device structures such as microstrip, coplanar waveguide, or slot lines as well as to different fabrication procedures such as a monolithic approach.

Although present invention has been described in terms of what are at present believed to be the preferred embodiments, it will be apparent to those skilled in the art that various changes may be made without departing from the scope of the invention. It is therefore intended that appended claims cover such changes.

What is claimed is:

1. A device for attenuating microwave signals above a preselected power level passed therethrough comprising:
   a pair of planar ferrite members;
   a plurality of signal-carrying conductors positioned between said ferrite members for carrying the microwave signals on an axis substantially parallel thereto; and
   a planar ground plane surrounding the ferrite members in spaced relation with respect to the conductors by a selected distance, said signal carrying conductors being separated by at least ten times the distance from the ground plane to the conductors such that microwave field coupling between adjacent conductors is negligible.

2. The device according to claim 1 further comprising magnetic means for providing at least a portion of a DC biasing field for said ferrite member.

3. The device according to claim 2 wherein said magnetic means provides RF shielding for said signal-carrying conductors.

4. The device according to claim 2 wherein said magnetic means is positioned against a side of said ferrite member opposite the signal-carrying conductors.

5. The device according to claim 1 wherein attenuation of the microwave signals having a power level below said predetermined threshold power level is substantially zero.

6. The device according to claim 1 wherein said ferrite members are made solely from a YIG material.

7. The device according to claim 1 wherein said signal-carrying conductors means are made from a gold material.

8. The device according to claim 1 wherein the device has a selected hand width of operation from about 2.4 to about 5.4 GHZ, attenuation of microwave signals in the device varies less than about 2 dB over said hand width.

9. The device according to claim 1 further including biasing means for establishing a magnetic biasing field in the plane of the ferrite and transverse to the signal carrying conductors.

10. The device according to claim 9 in which the biasing field is about 35 Oe.

11. The device according to claim 1 wherein the ferrite members have a width (w) as measured in a direction between the adjacent conductors and overall thickness (t) as measured normal to the confronting ferrite members defining an aspect ratio w/t of greater than about 12.7 per conductor.

12. The device according to claim 11 wherein the aspect ratio is about 63.5.

13. A device for attenuating microwave signals above a preselected power level passed therethrough comprising:
   a pair of generally planar ferrite members in confronting relationship;
   a plurality of signal carrying conductors positioned between the ferrite members for carrying the microwave signals on an axis substantially parallel thereto; and
   a planar ground plane spaced from the conductors surrounding the ferrite members, said conductors being spaced from each other by a distance at least approximately 10 times the distance to the ground plane.

14. A device for attenuating microwave signals above a preselected power level passed therethrough comprising:
   a pair of generally planar ferrite members in confronting relationship;

a plurality of signal carrying conductors positioned between said ferrite members for carrying the microwave signals on an axis substantially parallel thereto;

a pair of ground planes spaced from the conductors and disposed on the ferrite members, said conductors being separated from each other by a distance at least approximately 10 times the distance from the planar ground planes to the conductors.

15. The device according to claim 14 wherein the ground planes are interconnected on opposite sides of the ferrite members.

* * * * *